US012666988B2

(12) United States Patent
Parekh et al.

(10) Patent No.: US 12,666,988 B2
(45) Date of Patent: Jun. 23, 2026

(54) SEMICONDUCTOR DEVICE ASSEMBLIES WITH CAVITY-EMBEDDED CUBES AND LOGIC-SUPPORTING INTERPOSERS

(71) Applicant: Micron Technology, Inc., Boise, ID (US)

(72) Inventors: Kunal R. Parekh, Boise, ID (US); Bret K. Street, Meridian, ID (US); Terrence B. McDaniel, Boise, ID (US); Jaekyu Song, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 894 days.

(21) Appl. No.: 17/892,036

(22) Filed: Aug. 19, 2022

(65) Prior Publication Data

US 2024/0063068 A1    Feb. 22, 2024

(51) Int. Cl.
*H10W 70/68* (2026.01)
*H10W 70/60* (2026.01)
(Continued)

(52) U.S. Cl.
CPC .......... *H10W 70/68* (2026.01); *H10W 70/611* (2026.01); *H10W 70/641* (2026.01);
(Continued)

(58) Field of Classification Search
CPC .............. H01L 23/13; H01L 23/49816; H01L 23/49833; H01L 23/5382; H01L 23/5385; H01L 23/5386; H01L 25/0652; H01L 25/50; H01L 24/16; H01L 24/32; H01L 24/73; H01L 2224/16227; H01L 2224/32145; H01L 2224/32225; H01L 2224/73204; H01L 2224/73253; H01L 2924/1431; H01L 2924/1436; H01L 2924/1438; H01L 2924/1511;
(Continued)

(56) References Cited

U.S. PATENT DOCUMENTS

2012/0187578 A1*  7/2012  Li ..................... H01L 23/49827
257/778
2014/0078842 A1*  3/2014  Oh ....................... G11C 29/808
365/200
(Continued)

*Primary Examiner* — Jacob Y Choi
*Assistant Examiner* — Neil R Prasad
(74) *Attorney, Agent, or Firm* — Dorsey & Whitney LLP

(57) ABSTRACT

A semiconductor device assembly comprises a package substrate including (i) an upper surface having a plurality of internal contacts, (ii) a lower surface having a plurality of external contacts coupled to the plurality of internal contacts, and (iii) a cavity extending into the package substrate. The assembly further comprises a stack of first semiconductor devices disposed in the cavity, an uppermost first semiconductor device of the stack having a plurality of stack contacts, and an interposer including (i) a bottom surface having a first plurality of lower contacts coupled to the plurality of stack contacts and a second plurality of lower contacts coupled to the plurality of internal contacts, and (ii) a top surface having a plurality of upper contacts coupled to the first and second pluralities of lower contacts. The assembly further comprises a second semiconductor device including a plurality of die contacts coupled to the plurality of upper contacts.

17 Claims, 5 Drawing Sheets

(51) Int. Cl.

| | |
|---|---|
| *H10W 70/62* | (2026.01) |
| *H10W 70/65* | (2026.01) |
| *H10W 90/00* | (2026.01) |
| *H10W 72/00* | (2026.01) |
| *H10W 74/00* | (2026.01) |
| *H10W 74/15* | (2026.01) |

(52) U.S. Cl.
CPC ........... *H10W 70/65* (2026.01); *H10W 90/00* (2026.01); *H10W 90/401* (2026.01); *H10W 90/701* (2026.01); *H10W 70/60* (2026.01); *H10W 70/682* (2026.01); *H10W 72/877* (2026.01); *H10W 74/00* (2026.01); *H10W 74/15* (2026.01); *H10W 90/724* (2026.01); *H10W 90/732* (2026.01); *H10W 90/734* (2026.01)

(58) Field of Classification Search
CPC . H01L 2924/15153; H01L 2924/16195; H01L 2924/16235; H01L 2924/182
See application file for complete search history.

(56) References Cited

U.S. PATENT DOCUMENTS

| | | | |
|---|---|---|---|
| 2019/0103409 A1* | 4/2019 | Xu ...................... | H01L 25/0657 |
| 2021/0225805 A1* | 7/2021 | Watanabe .............. | H01L 24/96 |
| 2021/0225809 A1* | 7/2021 | Yu ......................... | H10N 50/01 |
| 2023/0282615 A1* | 9/2023 | Wagner .............. | H01L 23/3128 |
| | | | 257/686 |

* cited by examiner

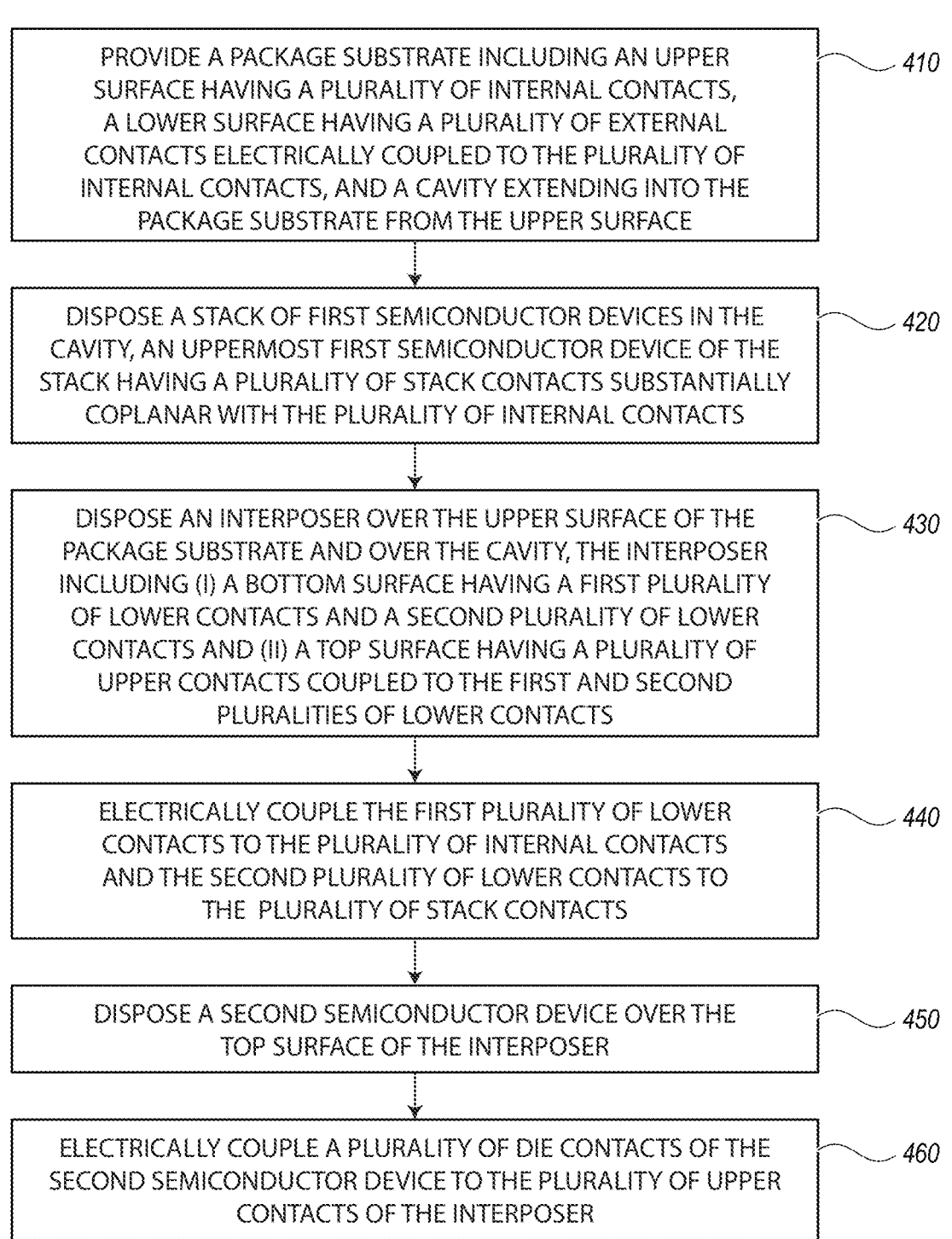

PROVIDE A PACKAGE SUBSTRATE INCLUDING AN UPPER SURFACE HAVING A PLURALITY OF INTERNAL CONTACTS, A LOWER SURFACE HAVING A PLURALITY OF EXTERNAL CONTACTS ELECTRICALLY COUPLED TO THE PLURALITY OF INTERNAL CONTACTS, AND A CAVITY EXTENDING INTO THE PACKAGE SUBSTRATE FROM THE UPPER SURFACE — 410

DISPOSE A STACK OF FIRST SEMICONDUCTOR DEVICES IN THE CAVITY, AN UPPERMOST FIRST SEMICONDUCTOR DEVICE OF THE STACK HAVING A PLURALITY OF STACK CONTACTS SUBSTANTIALLY COPLANAR WITH THE PLURALITY OF INTERNAL CONTACTS — 420

DISPOSE AN INTERPOSER OVER THE UPPER SURFACE OF THE PACKAGE SUBSTRATE AND OVER THE CAVITY, THE INTERPOSER INCLUDING (I) A BOTTOM SURFACE HAVING A FIRST PLURALITY OF LOWER CONTACTS AND A SECOND PLURALITY OF LOWER CONTACTS AND (II) A TOP SURFACE HAVING A PLURALITY OF UPPER CONTACTS COUPLED TO THE FIRST AND SECOND PLURALITIES OF LOWER CONTACTS — 430

ELECTRICALLY COUPLE THE FIRST PLURALITY OF LOWER CONTACTS TO THE PLURALITY OF INTERNAL CONTACTS AND THE SECOND PLURALITY OF LOWER CONTACTS TO THE PLURALITY OF STACK CONTACTS — 440

DISPOSE A SECOND SEMICONDUCTOR DEVICE OVER THE TOP SURFACE OF THE INTERPOSER — 450

ELECTRICALLY COUPLE A PLURALITY OF DIE CONTACTS OF THE SECOND SEMICONDUCTOR DEVICE TO THE PLURALITY OF UPPER CONTACTS OF THE INTERPOSER — 460

SEMICONDUCTOR DEVICE ASSEMBLIES WITH CAVITY-EMBEDDED CUBES AND LOGIC-SUPPORTING INTERPOSERS

TECHNICAL FIELD

The present disclosure generally relates to semiconductor device assemblies, and more particularly relates to semiconductor device assemblies with cavity-embedded cubes and logic-supporting interposers.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

BRIEF DESCRIPTION OF THE DRAWINGS

FIG. 2 is a simplified schematic partial cross-sectional view of a semiconductor device assembly in accordance with embodiments of the present technology.

FIG. 3 is a simplified schematic partial cross-sectional view of a semiconductor device assembly in accordance with embodiments of the present technology.

FIG. 4 is a flow chart illustrating a method of making a semiconductor device assembly in accordance with an embodiment of the present technology.

DETAILED DESCRIPTION

Various embodiments of the present application provide semiconductor device assemblies in which a package substrate includes one or more cavities in which stacks of memory devices (e.g., "cubes" of memory) can be disposed, and over which can be a provided an interposer carrying a logic device. The interposer can provide connectivity among the logic device, the stack(s) in the one or more cavities, and the package substrate. The assembly can further include an encapsulant at least partially encapsulating the logic device, the interposer, and the package substrate. With the logic die uppermost in the assembly, the encapsulant can optionally be substantially coplanar with an upper surface of the logic die to permit easier heat extraction from the logic device, and a thermal lid can optionally be provided over the encapsulant, and in direct contact with or proximate to the logic device.

Figure 1:
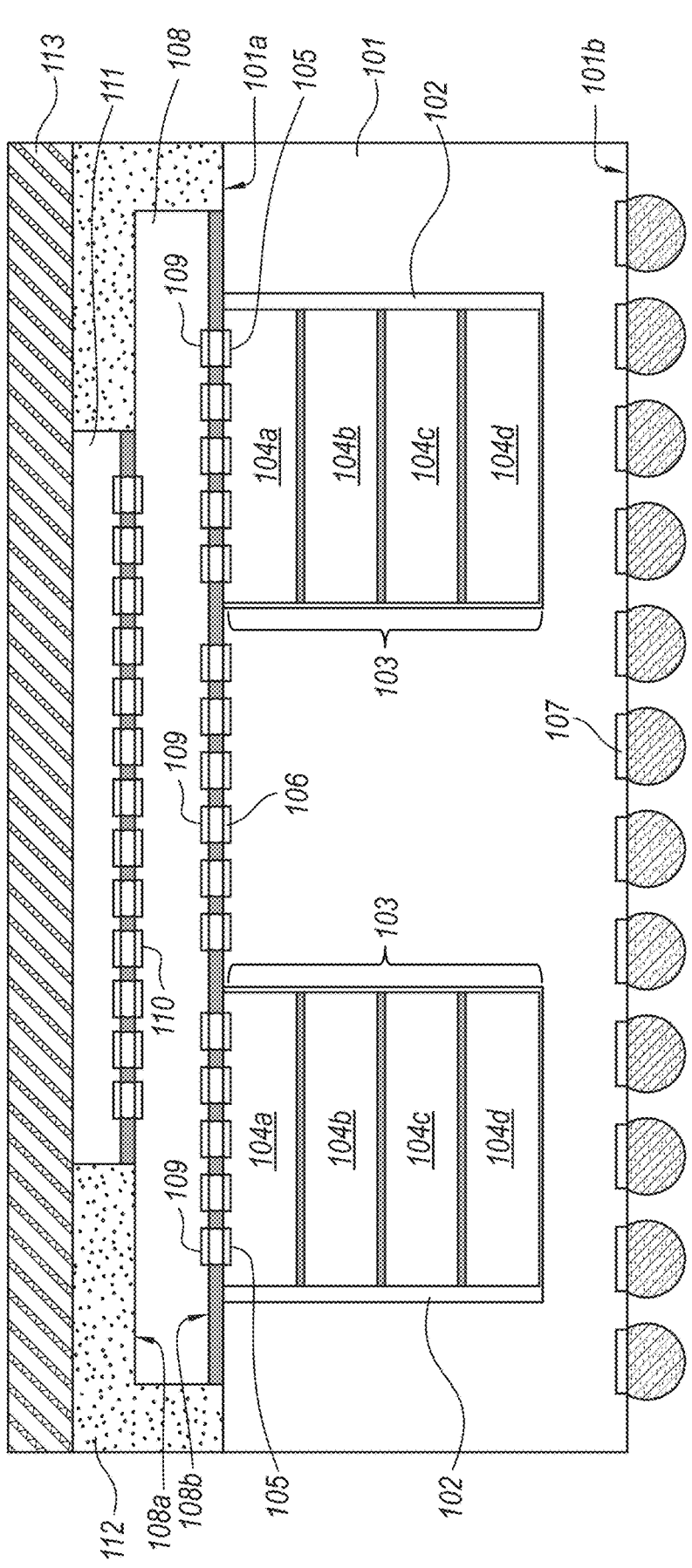
FIG. 1 is a simplified schematic cross-sectional view of an example semiconductor device assembly in accordance with embodiments of the present technology.

FIG. 1 is a simplified schematic cross-sectional view of a semiconductor device assembly 100 in accordance with embodiments of the present technology. As can be seen with reference to FIG. 1, assembly 100 can include a substrate 101 in which are formed cavities 102. The cavities 102 can be deep enough to accommodate stacks 103 of memory devices 104a-104d (e.g., vertical stack of dies interconnected by through-silicon vias (TSVs) and interconnects, omitted from the illustration for clarity), with an uppermost memory device 104a of each stack 103 having a plurality of die contacts 105 (e.g., at an active surface of the memory device 104a) substantially coplanar (e.g., with less than 1 μm of deviation from coplanarity, less than 5 μm of deviation from coplanarity, less than 10 μm of deviation from coplanarity, or less than 50 μm of deviation from coplanarity) with an upper surface 101a of the substrate 101. The upper surface 101a of the substrate 101 can further include internal contacts 106, coupled by traces, lines, vias, and other electrical connection structures (not illustrated) in the substrate 101 to external contacts 107 at a lower surface 101b of the substrate 101.

The assembly 100 can further include an interposer 108 disposed over the upper surface 101a of the substrate 100, with bottom contacts 109 at a bottom surface 108b of the interposer 108 coupled to both the die contacts 105 of each stack 103 and the internal contacts 106 of the package substrate. The interposer further includes top contacts 110 at a top surface 108a of the interposer 108. A logic device 111 can be carried by the interposer, and the logic device can be electrically coupled to the top contacts 110 of the interposer 108, such that the logic device 111 is in electrical communication both with the stacks 103 of memory devices 104a-104d and with the package substrate 101, and through the package substrate 101 to the external contacts 107. The assembly 100 can further include an encapsulant material 112 (e.g., mold resin compound or the like) provided over and around the package substrate 101 and the interposer 108, and optionally over the logic device 111. The assembly 100 can further include a thermally conductive lid 113 over the logic device 111, either directly attached thereto (e.g., by a layer of thermal interface material (TIM)), or in thermal contact through a portion of the encapsulant material 112.

Figure 2:
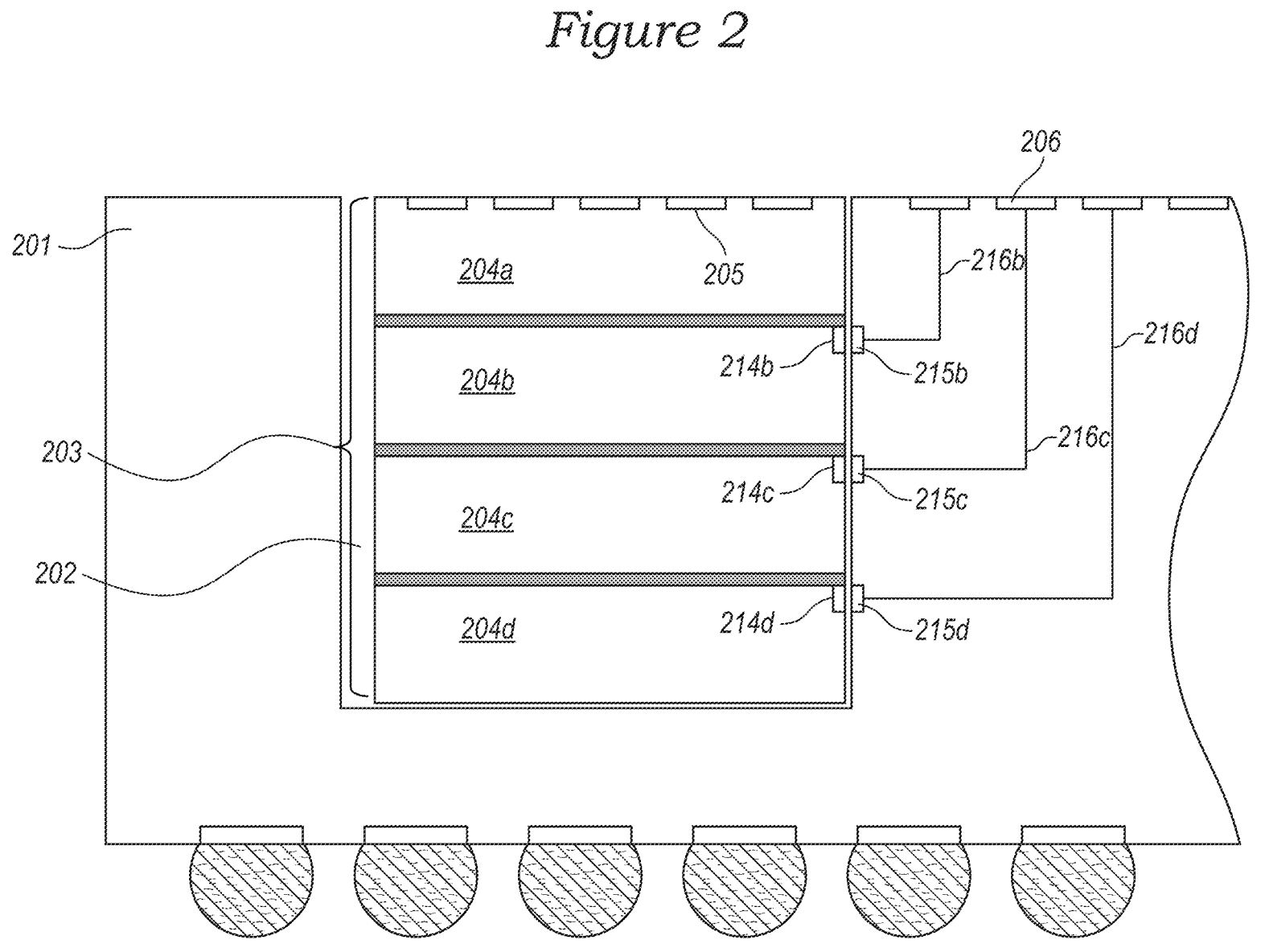

According to one aspect of the present disclosure, the package substrate 101 can be a multi-layer printed circuit board (PCB). In this regard, to accommodate the height of a stack of memory devices (which stack may have a height from 0.1 mm to 5.0 mm), the package substrate 101 may be thick enough to include large number of routing layers (e.g., more than 5, more than 10, more than 20, etc.). Moreover, a thick package substrate with deep cavities can enjoy a number of additional benefits, such as the ability to accommodate structures in the package substrate that further facilitate the interconnection of semiconductor devices in various ways. FIG. 2 is a simplified schematic partial cross-sectional view of a semiconductor device assembly illustrating some of these beneficial structures in accordance with embodiments of the present technology.

FIG. 2 illustrates a partial view of a semiconductor device assembly 200 similar to the semiconductor device assembly 100 of FIG. 1, with several features (e.g., the interposer, second semiconductor device, encapsulant, etc.) omitted for clarity. Unlike the package substrate 101 in the semiconductor device assembly 100 of FIG. 1, the package substrate 201 illustrated in FIG. 2 includes one or more wireless interconnect structures 215b-215d at a sidewall of a cavity 202, which are configured to couple to similar wireless interconnect structures 214b-214d corresponding to lower dies 204b-204d in the stack 203 of dies in the cavity 202 (i.e., dies other than the uppermost die 204a). The wireless interconnect structures 214b-214d and 215b-215d can employ any one of a number of wireless communication techniques, including capacitive, inductive, optical, and the like. The wireless interconnect structures 214b-214d of the stack 203 may be formed at an active surface of corresponding dies 204b-204d in the stack 203, or may alternatively (or additionally) be formed between adjacent dies 204a-204d in the stack 203 (e.g., formed in a redistribution layer (RDL) disposed between adjacent dies 204a-204d in the stack 203 and coupled to corresponding dies via lines, traces, vias, and/or other conductive structures in the RDL). The wireless interconnect structures 215b-215d at the sidewall of the cavity 202 can be coupled, via electrical paths 216b-216d (e.g., including vias, traces, lines, and other conductive structures of the substrate 201) to various internal contacts 206 at a top surface of the substrate 201, and/or to external contacts 207 at a lower surface of the substrate 201. The wireless interconnect structures 215b-215d at the sidewall of the cavity 202 may be formed in a single layer of the substrate 201, or may have sufficient dimensions that they extend through multiple layers of the substrate 201.

According to one aspect of the present disclosure, the wireless interconnect structures at the sidewall of a cavity may be coupled to one or more of the internal or external contacts of the substrate through a configurable matrix, such as a fuse array, such that the routing between one sidewall interconnect structure and one package contact can be selected at the time of assembly by, e.g., blowing fuses or anti-fuses to select a desired mapping between interconnect structures and package contacts. A semiconductor device assembly employing such an approach is illustrated in the simplified schematic partial cross-sectional view of FIG. 3, in accordance with embodiments of the present technology.

Figure 3:
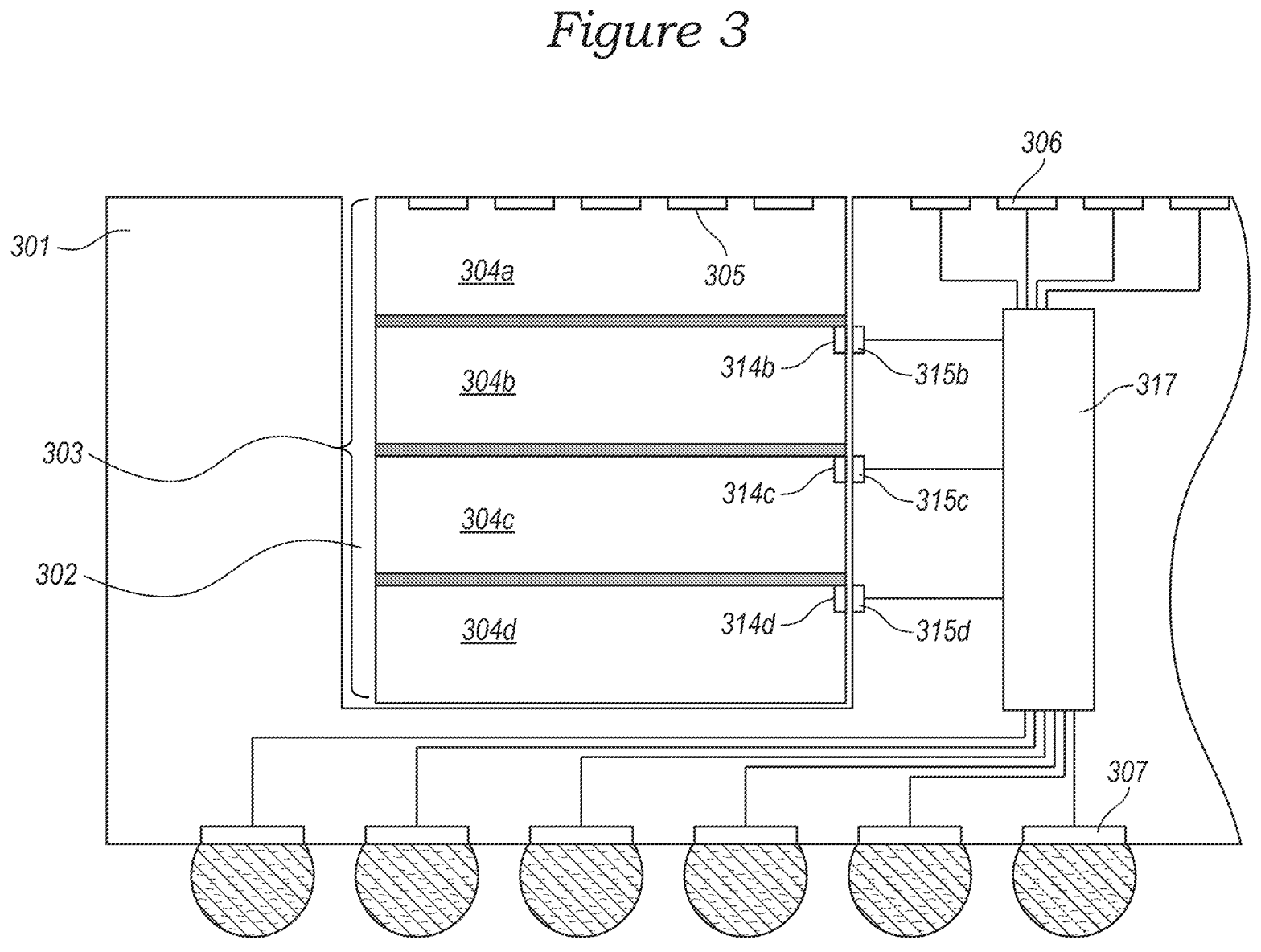

As can be seen with reference to FIG. 3, a semiconductor device assembly 300 includes a similar package substrate 301 to the package substrate 201, in that the package substrate 301 includes one or more wireless interconnect structures 315b-315d at a sidewall of a cavity 302, which are configured to couple to similar wireless interconnect structures 314b-314d corresponding to lower dies 304b-304d in the stack 303 of dies in the cavity 302 (i.e., dies other than the uppermost die 304a). The wireless interconnect structures 314b-314d and 315b-315d can employ any one of a number of wireless communication techniques, including capacitive, inductive, optical, and the like. The wireless interconnect structures 314b-314d of the stack 303 may be formed at an active surface of corresponding dies 304b-304d in the stack 303, or may alternatively (or additionally) be formed between adjacent dies 304a-304d in the stack 303 (e.g., formed in a redistribution layer (RDL) disposed between adjacent dies 304a-304d in the stack 303 and coupled to corresponding dies via lines, traces, vias, and/or other conductive structures in the RDL). The wireless interconnect structures 315b-315d at the sidewall of the cavity 302 can be coupled, via a configurable matrix 317 (e.g., fuse or anti-fuse array, illustrated schematically) to various internal contacts 306 at a top surface of the substrate 231, and/or to external contacts 307 at a lower surface of the substrate 301. The routing between one (or more) sidewall interconnect structure(s) and one (or more) package contact(s) can be selected at the time of assembly (or during the life of the assembly) by, e.g., blowing fuses or anti-fuses to select a desired mapping between interconnect structures and package contacts.

One benefit to a configurable matrix like that illustrated in FIG. 3 is that, in an embodiment in which the number of wireless interconnect structures at a sidewall of a cavity exceeds the number of wireless interconnect structures at a sidewall of a die stack, a greater flexibility in alignment of the die stack with the cavity can be permitted, in accordance with one aspect of the present disclosure. In this regard, rather than aligning particular wireless interconnects of the die stack with particular wireless interconnects of the cavity, the die stack can be simply placed into the cavity and, by probing the die stack and the package substrate, a determination can be made regarding which of the cavity wireless interconnects aligns with a particular one of the die stack wireless interconnects, and mapping the cavity wireless interconnect as desired to the appropriate package contact (s). This determination and mapping may be performed after securing the die stack in the cavity (e.g., with adhesive, underfill, mold material, or the like, omitted from the illustration for clarity), or may in other embodiments be performed before so securing the die stack (to permit alignment adjustments made with feedback from the probing process, to, e.g., maximize a signal-to-noise ratio or other optimize the physical alignment).

Although in the foregoing example embodiment semiconductor device assemblies have been illustrated and described with wireless interconnections provided between lower dies in a stack of dies disposed in a cavity to the exclusion of an uppermost die, in other embodiments the uppermost die in such a stack could additionally or alternatively be provided with wireless interconnections as well. Moreover, although in the foregoing example embodiment semiconductor device assemblies have been illustrated and described with wireless interconnect structures at sidewalls of die stacks and package cavities, in other embodiments the interconnect structures could additionally or alternatively be direct connections (e.g. contact pads, solder balls, pins, pads, etc.). According to another aspect of the present disclosure, thermal interconnect structures may additionally or alternatively be provided at sidewalls of the cavities and die stacks, and configured to conduct heat away from the die stack and into the substrate (e.g., to thermal vias or other heat dissipation structures).

Although in the foregoing example embodiment semiconductor device assemblies have been illustrated and described with multiple cavities, in other embodiment of the present disclosure a package substrate may have a single cavity rather than a plurality. Moreover, although in the foregoing example embodiment semiconductor device assemblies have been illustrated and described with die stacks including multiple dies disposed in a cavity of a package substrate, in other embodiments of the present disclosure, a single die may instead by disposed in the cavity of a package substrate while still enjoying the benefit of wireless, direct, or thermal interconnections between a sidewall of the cavity and a sidewall of the die.

Although in the foregoing example embodiment semiconductor device assemblies have been illustrated and described with a single interposer carrying a single die, in other embodiments of the present disclosure assemblies may include different numbers of interposer (e.g., more than one), and interposers may carry more than one die, either directly attached to the interposer, or in a stack. Moreover, although in the foregoing example embodiment semiconductor device assemblies have been illustrated and described with an interposer intervening between a second semiconductor device and the package substrate in which dies or die stacks are provided in cavities, in other embodiments of the present disclosure a second semiconductor device may be disposed directly over the upper surface of a substrate and directly electrically coupled to the contacts of the package substrate and/or to the die contacts at the uppermost die in the cavity.

FIG. 4 is a flow chart illustrating a method of making a semiconductor device assembly. The method includes providing a package substrate including an upper surface having a plurality of internal contacts, a lower surface having a plurality of external contacts electrically coupled to the plurality of internal contacts, and a cavity extending into the package substrate from the upper surface (box 410). The method further includes disposing a stack of first semiconductor devices disposed in the cavity, an uppermost first semiconductor device of the stack having a plurality of stack contacts substantially coplanar with the plurality of internal contacts (box 420). The method further includes disposing an interposer over the upper surface of the package substrate and over the cavity, the interposer including (i) a bottom surface having a first plurality of lower contacts and a second plurality of lower contacts and (ii) a top surface having a plurality of upper contacts coupled to the first and second pluralities of lower contacts (box 430). The method further includes electrically coupling the first plurality of lower contacts to the plurality of internal contacts and the second plurality of lower contacts to the plurality of stack contacts (box 440). The method further includes disposing a second semiconductor device over the top surface of the interposer (box 450) and electrically coupling a plurality of die contacts of the second semiconductor device to the plurality of upper contacts of the interposer (box 460). The method can further include at least partially encapsulating, with an encapsulant material, the package substrate, the interposer, and the second semiconductor device and attaching a thermally conductive lid to the encapsulant material.

In accordance with one aspect of the present disclosure, the semiconductor devices illustrated in the assemblies of FIGS. 1-4 could be memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 5:
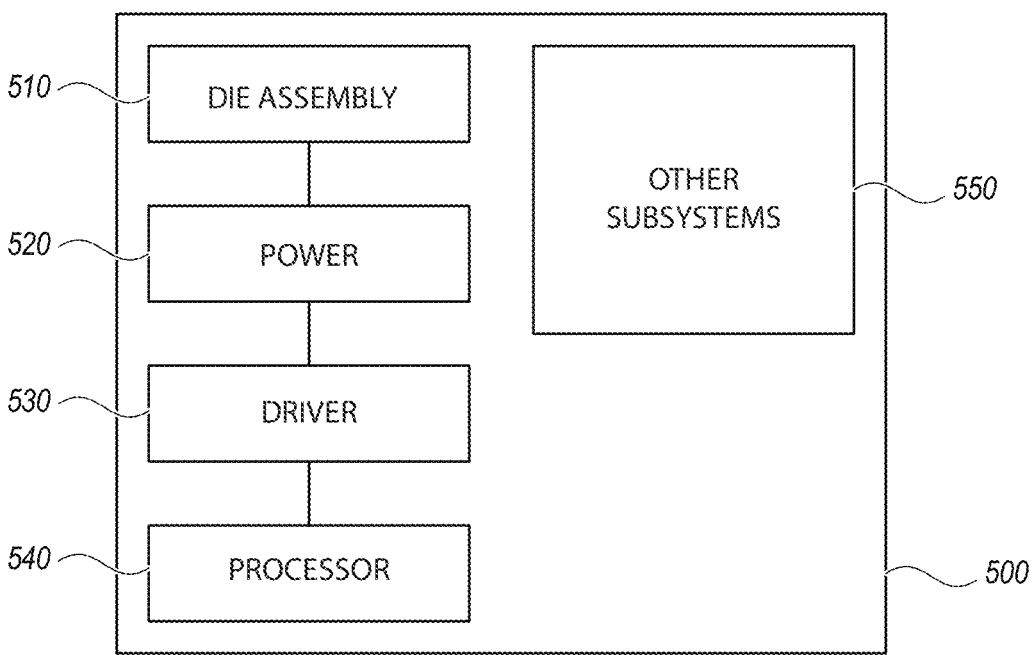
FIG. 5 is a schematic view showing a system that includes a semiconductor device assembly configured in accordance with an embodiment of the present technology.

Any one of the semiconductor devices and semiconductor device assemblies described above with reference to FIGS. 1-4 can be incorporated into any of a myriad of larger and/or more complex systems, a representative example of which is system 500 shown schematically in FIG. 5. The system 500 can include a semiconductor device assembly (e.g., or a discrete semiconductor device) 502, a power source 504, a driver 506, a processor 508, and/or other subsystems or components 510. The semiconductor device assembly 502 can include features generally similar to those of the semiconductor devices described above with reference to FIGS. 1-4. The resulting system 500 can perform any of a wide variety of functions, such as memory storage, data processing, and/or other suitable functions. Accordingly, representative systems 500 can include, without limitation, handheld devices (e.g., mobile phones, tablets, digital readers, and digital audio players), computers, vehicles, appliances and other products. Components of the system 500 may be housed in a single unit or distributed over multiple, interconnected units (e.g., through a communications network). The components of the system 500 can also include remote devices and any of a wide variety of computer readable media.

Specific details of several embodiments of semiconductor devices, and associated systems and methods, are described above. Suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
a package substrate including:
    an upper surface having a plurality of internal contacts,
    a lower surface having a plurality of external contacts electrically coupled to the plurality of internal contacts, and
    a cavity extending into the package substrate from the upper surface, wherein the plurality of internal contacts of the upper surface are spaced laterally away from the cavity;
a stack of first semiconductor devices disposed in the cavity, an uppermost first semiconductor device of the stack of first semiconductor devices having a plurality of stack contacts substantially coplanar with the plurality of internal contacts;
an interposer disposed over the upper surface of the package substrate, over the uppermost first semiconductor device, and over the cavity, the interposer including:
    a bottom surface having a first plurality of lower contacts electrically coupled to the plurality of stack contacts and a second plurality of lower contacts electrically coupled to the plurality of internal contacts, and
    a top surface having a plurality of upper contacts coupled to the first and second pluralities of lower contacts;
a second semiconductor device disposed over the top surface of the interposer and including a plurality of die contacts electrically coupled to the plurality of upper contacts; and
an encapsulant material that at least partially encapsulates the interposer and the second semiconductor device, a bottom surface of the encapsulant material being in contact with the upper surface of the package substrate.

2. The semiconductor device assembly of claim 1, wherein the package substrate is a printed circuit board.

3. The semiconductor device assembly of claim 1, wherein the interposer is a printed circuit board.

4. The semiconductor device assembly of claim 1, wherein the first semiconductor devices are memory dies and wherein the second semiconductor device is a memory controller configured to manage the memory dies.

5. The semiconductor device assembly of claim 1, further comprising a wireless interconnect structure disposed at a sidewall of the cavity and configured to communicate with a lower first semiconductor device of the stack of first semiconductor devices.

6. The semiconductor device assembly of claim 5, wherein the wireless interconnect structure is coupled to an internal contact of the plurality of internal contacts or to an external contact of the plurality of external contacts through a configurable fuse array.

7. The semiconductor device assembly of claim 1, wherein:
    the cavity is a first cavity,
    the plurality of stack contacts is a first plurality of stack contacts,
    the package substrate further includes a second cavity extending into the package substrate from the upper surface,
    the semiconductor device assembly further comprises a stack of third semiconductor devices disposed in the second cavity, an uppermost third semiconductor device of the stack of third semiconductor devices having a second plurality of stack contacts substantially coplanar with the plurality of internal contacts, and
    the bottom surface of the interposer includes a third plurality of lower contacts electrically coupled to the second plurality of stack contacts.

8. The semiconductor device assembly of claim 1, further comprising a thermally conductive lid disposed over the encapsulant material.

9. A semiconductor device assembly, comprising:
a package substrate including:
    an upper surface having a plurality of internal contacts,
    a lower surface having a plurality of external contacts electrically coupled to the plurality of internal contacts, and
    a plurality of cavities extending into the package substrate from the upper surface, wherein the plurality of internal contacts of the upper surface are spaced laterally away from the plurality of cavities;
a plurality of stacks of first semiconductor devices, each stack of the plurality of stacks of first semiconductor devices being disposed in a corresponding cavity of the plurality of cavities, an uppermost first semiconductor device of each stack having a plurality of stack contacts substantially coplanar with the plurality of internal contacts;
an interposer disposed over the upper surface of the package substrate, over the uppermost first semiconductor device of each stack, and over the cavity plurality of cavities, the interposer including:
    a bottom surface having a first plurality of lower contacts electrically coupled to the plurality of stack contacts of each of the plurality of stacks of first semiconductor devices and a second plurality of lower contacts electrically coupled to the plurality of internal contacts, and
    a top surface having a plurality of upper contacts coupled to the first and second pluralities of lower contacts;

a second semiconductor device disposed over the top surface of the interposer and including a plurality of die contacts electrically coupled to the plurality of upper contacts; and an encapsulant material that at least partially encapsulates the interposer and the second semiconductor device, a bottom surface of the encapsulant material being in contact with the upper surface of the package substrate.

10. The semiconductor device assembly of claim 9, wherein the package substrate is a printed circuit board.

11. The semiconductor device assembly of claim 9, wherein the interposer is a printed circuit board.

12. The semiconductor device assembly of claim 9, wherein the first semiconductor devices are memory dies and wherein the second semiconductor device is a memory controller configured to manage the memory dies.

13. The semiconductor device assembly of claim 9, further comprising a wireless interconnect structure disposed at a sidewall of each of the plurality of cavities and configured to communicate with a lower first semiconductor device of the corresponding stack.

14. The semiconductor device assembly of claim 13, wherein each wireless interconnect structure is coupled to an internal contact of the plurality of internal contacts or to an external contact of the plurality of external contacts through a configurable fuse array.

15. The semiconductor device assembly of claim 9, further comprising a thermally conductive lid disposed over the encapsulant material.

16. A method of making a semiconductor device assembly, comprising:

providing a package substrate including an upper surface having a plurality of internal contacts, a lower surface having a plurality of external contacts electrically coupled to the plurality of internal contacts, and a cavity extending into the package substrate from the upper surface, wherein the plurality of internal contacts of the upper surface are spaced laterally away from the cavity;

disposing a stack of first semiconductor devices in the cavity, an uppermost first semiconductor device of the stack of first semiconductor devices having a plurality of stack contacts substantially coplanar with the plurality of internal contacts;

disposing an interposer over the upper surface of the package substrate, over the uppermost first semiconductor device, and over the cavity, the interposer including (i) a bottom surface having a first plurality of lower contacts and a second plurality of lower contacts and (ii) a top surface having a plurality of upper contacts coupled to the first and second pluralities of lower contacts;

electrically coupling the first plurality of lower contacts to the plurality of internal contacts and the second plurality of lower contacts to the plurality of stack contacts;

disposing a second semiconductor device over the top surface of the interposer;

electrically coupling a plurality of die contacts of the second semiconductor device to the plurality of upper contacts of the interposer; and at least partially encapsulating the interposer and the second semiconductor device with an encapsulant material, a bottom surface of the encapsulant material being in contact with the upper surface of the package substrate.

17. The method of claim 16, further comprising attaching a thermally conductive lid to the encapsulant material.

* * * * *